(12) United States Patent
Mayer

(10) Patent No.: US 10,269,780 B2
(45) Date of Patent: Apr. 23, 2019

(54) DEVICE FOR IMAGE REPRESENTATION

(71) Applicant: TFFI GMBH & CO KG, Vienna (AT)

(72) Inventor: Sebastian Mayer, Neusiedl am See (AT)

(73) Assignee: TFFI GMBH & CO KG, Vienna (AT)

( * ) Notice: Subject to any disclaimer, the term of this patent is extended or adjusted under 35 U.S.C. 154(b) by 0 days.

(21) Appl. No.: 15/771,992

(22) PCT Filed: Oct. 28, 2016

(86) PCT No.: PCT/EP2016/076011
§ 371 (c)(1),
(2) Date: Apr. 27, 2018

(87) PCT Pub. No.: WO2017/072269
PCT Pub. Date: May 4, 2017

(65) Prior Publication Data
US 2018/0342493 A1 Nov. 29, 2018

(30) Foreign Application Priority Data
Oct. 28, 2015 (EP) .................... 15191954

(51) Int. Cl.
*H01L 33/00* (2010.01)
*H01L 25/16* (2006.01)
(Continued)

(52) U.S. Cl.
CPC ........ *H01L 25/167* (2013.01); *F21V 21/0808* (2013.01); *H01L 25/0753* (2013.01); *F21Y 2115/10* (2016.08); *G09F 13/20* (2013.01)

(58) Field of Classification Search
CPC ............... H01L 25/167; H01L 25/0753; F21V 21/0808; F21Y 2115/10; G09F 13/20
(Continued)

(56) References Cited

U.S. PATENT DOCUMENTS 8,360,608 B2   1/2013   Wildner
2006/0221637 A1*  10/2006  Chikugawa ........ H05B 33/0818
                                                            362/612
(Continued)

FOREIGN PATENT DOCUMENTS

CN    101535710 A    9/2009
CN    103460275 A    12/2013
(Continued)

OTHER PUBLICATIONS

ISA European Patent Office, International Search Report Issued in Application No. PCT/EP2016/076011, dated Jan. 5, 2017, WIPO, 6 pages.

*Primary Examiner* — Long K Tran
(74) *Attorney, Agent, or Firm* — McCoy Russell LLP

(57) ABSTRACT

The invention relates to a device for image representation comprising a carrier body, on which are arranged individually driveable luminous bodies connected respectively to a drive unit, wherein the carrier body has a first electrically conductive layer facing the luminous bodies, a second electrically conductive layer facing away from the luminous bodies, and a light-guiding layer for guiding light signals, said light-guiding layer being arranged between the first electrically conductive layer and the second electrically conductive layer, wherein the drive units are connected to the light-guiding layer via light-detecting connections, wherein first electrical connections for connecting the drive units to the first electrically conductive layer and second electrical connections for connecting the drive units to the second electrically conductive layer are provided, wherein the drive units are designed for driving the luminous bodies depending on light signals fed into the light-guiding layer.

12 Claims, 2 Drawing Sheets

(51) Int. Cl.
*H01L 25/075* (2006.01)
*F21V 21/08* (2006.01)
F21Y 115/10 (2016.01)
G09F 13/20 (2006.01)

(58) Field of Classification Search
USPC .......................................................... 257/99
See application file for complete search history.

(56) References Cited

U.S. PATENT DOCUMENTS

2009/0297156 A1 12/2009 Nakagawa et al.
2013/0049032 A1* 2/2013 Matsumi ............. H01L 51/0004
257/88

FOREIGN PATENT DOCUMENTS

DE 102006031345 A1 1/2008
EP 1600688 A1 11/2005
EP 2869670 A1 5/2015

* cited by examiner

DEVICE FOR IMAGE REPRESENTATION

CROSS-REFERENCE TO RELATED APPLICATIONS

The present application is a U.S. National Phase of International Patent Application Serial No. PCT/EP2016/076011 entitled "DEVICE FOR IMAGE REPRESENTATION," filed on Oct. 28, 2016. International Patent Application Serial No. PCT/EP2016/076011 claims priority to European Patent Application No. 15191954.5, filed on Oct. 28, 2015. The entire contents of each of the above-cited applications are hereby incorporated by reference in their entirety for all purposes.

TECHNICAL FIELD

The invention relates to a device for image representation comprising a carrier body, on which are arranged individually driveable luminous bodies connected respectively to a drive unit.

BACKGROUND AND SUMMARY

Devices of the above type are known from the prior art. For example, light emitting diodes (LEDs) arranged in the manner of a light chain can each be connected to a programmable microcontroller, to thus avoid separate control lines to each LED and to have to provide, except for two power supply lines, a total of only one bus line. In this way, LED strips with individually driveable LEDs can be formed to display different patterns. In addition, LED panels are known for the display of fonts and video contents.

The EP 1 600 688 A1 shows a luminous area for image representation, comprising a support surface on which individually driveable LEDs are mounted or embedded. The support surface is designed in a translucent manner on both sides, and the LEDs are arranged at a distance from each other in such a way that ambient light can be seen to pass through the luminous area. The LEDs may comprise a drive unit, for example an integrated circuit, and may be switched on and off or dimmed via matrix-like lines or wirelessly, for example via inductive or capacitive coupling. For the control of the individual LEDs addresses can be assigned to them, which are transmitted digitally.

The DE 10 2006 031345 A1 discloses a different type of a form-flexible lighting system having at least one light emitting diode arranged on a flexible carrier material. This arrangement is accommodated in a hollow-section rail with a substantially rectangular cross-section, in which the light-emitting diodes are arranged adjacent and form a common luminous area. At the front end, the hollow-section rail is closed by an end piece and/or an electric plug system. The hollow-section rail can be plugged in an installation profile in a form-fitting manner for fixing the lighting system.

From US 2009/297156 A1 a different type of lighting system and light communication system is known which transmits, from a plurality of lighting units and an optical communication unit, the data over the air to the lighting units. The lighting units receive light from the optical communication unit but also from other lighting units. Thus, data are recorded simultaneously, the emitted light of the lighting units being modulated in accordance with this data.

The EP 2 869 670 A1 shows a different luminous body or light assembly having a plurality of light modules or luminous segments, whose position within the luminous body is determined by means of ascertaining the temperature of the respective light module with the help of a temperature sensor. An address is allocated to the respective light module depending on said position.

The disadvantage here is the inflexible positioning of the LEDs, since they have to be arranged at least at intervals relative to one another, which intervals ensure a clearly recognizable light transmittance of the luminous area. In addition, the disclosed luminous area is constructed in a complex manner.

Therefore, it is the aim of the invention to create a device for image representation of the type mentioned above, which avoids or at least reduces the disadvantages known from the prior art. The device is to allow a positioning of the luminous bodies as flexible as possible on a carrier body that can be produced as uniformly, simply and economically as possible. In addition, the design of the device is to ensure a reliable operation even under heavy mechanical stress. In particular, the device should be designed for the display of colour, characters and/or images of constant or rapidly changing information for different fields of application and the shape should be easy to be changed by a user after the production process.

This object is achieved by a device comprising the features of claim 1. Preferred embodiments are given in the dependent claims.

According to the invention, the carrier body comprises a first electrically conductive layer facing the luminous bodies, a second electrically conductive layer facing away from the luminous bodies and a light-guiding layer configured to guide light signals, said light-guiding layer being arranged between the first and second electrically conductive layers, wherein the drive units are connected to the light-guiding layer via light-capturing or light signal receiving connections, wherein first electrical connections connecting the drive units to the first electrically conductive layer and second electrical connections connecting the drive units to the second electrically conductive layer are provided, wherein the drive units drive the luminous bodies depending on light signals fed into the light-guiding layer.

The carrier body thus comprises at least three layers preferably interconnected in flat manner, of which the first and second electrically conductive layers serve to provide the power supply, preferably the direct current supply, of the drive units and the respective luminous bodies connected thereto, while the light-guiding layer serves both to electrically insulate the first from the second electrically conductive layer and to transmit light signals to the drive units. The light signals contain information, in particular control and address information for the operation of the luminous bodies. Said information is collected by all drive units connected to the light-guiding layer, the drive units being designed to process the control and address information. The address information, hereinafter also referred to as addresses, is unique, so that each address is assigned to a single luminous body or a defined group of luminous bodies. In addition, the control information is assigned to the addresses, so that the drive units for controlling the respective luminous body connected therewith convert only that control information into electrical signals which is assigned to the address of the luminous body. The control information may include whether and for which optical representation a luminous body should be activated or deactivated. This means that the control and address information for all luminous bodies will be transmitted via a single light-guiding layer and will be evaluated by the drive units.

The drive units may be part of the luminous bodies or may be connected to them. In addition, the drive units are connected to the light-guiding layer via light-capturing connections, to the first electrically conductive layer via first electrical connections and to the second electrically conductive layer via second electrical connections. The light-capturing connections and the first and second electrical connections can be provided in the carrier body, with the drive units then being designed for the production of an optically and electrically conductive connection by being placed on the connections serving as contacts. However, each drive unit preferably has a light-capturing connection and a first and a second electrical connection. For establishing the contacts to the light-guiding layer and the electrically conductive layers, the three connections can be inserted into contact bores previously provided in the carrier body. However, in terms of their design and mechanical stability the three connections are preferably designed in such a way that they can be pierced into the carrier body without prior production of the contact bores.

In order to be able to evaluate the light signals, a light receiver, which converts the light signals into electrical signals, is provided in the drive unit, for example in the light-capturing connection of the drive unit. For a small size of the light-capturing connection, however, it is favourable to place the light receiver in a section of the drive unit outside the light-capturing connection, the light-capturing connection then being designed as an optical waveguide which transmits the light signals from the light-guiding layer to the light receiver.

A particularly expedient design of the carrier body, for example, provides that the upper and lower electrically conductive layers are essentially electrically conductive over their entire extent and the light-guiding layer is essentially light-guiding over its entire extent. As compared to carrier bodies with individual conductor tracks, such a design of the carrier body allows a substantially arbitrary positioning of the luminous bodies on the carrier body, which can thus be produced uniformly, simply and cost-effectively for various applications. The carrier body can be manufactured in any size, essentially limited by the manufacturing process, for example ranging from a few $cm^2$ to several $m^2$.

The light-guiding layer for transmitting the control and address information for the luminous bodies and also acting as insulation layer has the essential advantage over the transmission of the control and address information via the first and second electrically conductive layers or via a dense network of electrical conductor paths known from the prior art that the control and address information can be transmitted at high data rates, even when the insulation layer is very thin. Since only DC voltage or at least a low-frequency voltage is applied to the first and second electrically conductive layers, the capacitive effect between the first and second electrically conductive layers close to one another has no influence on a high data rate of the control and address information. Thus, the construction according to the invention of the device enables in particular the realization of displays with many luminous bodies to be driven and/or a high frame rate, i.e. a high number of images per second to be displayed with the device. A device of such design also permits the subsequent reduction in the size of the carrier body, since the layers provided for the power supply and the transmission of light signals are areally (in flat manner) interconnected, and severing a portion does not impair the function of the device reduced in size thereby. Conveniently, the carrier body is made of materials that can be severed with simple tools. The device according to the invention for image representation can thus be cut to the desired size and shape by the user after the manufacturing process, and thus it provides an essential advantage over known devices or displays manufactured with unchangeable dimensions and shapes. Thus, a special design of a display surface according to the prior art requires a generally very expensive change of the manufacturing process. In comparison, devices according to the invention can be both manufactured at low costs, if necessary with different dimensions, and be subsequently modified in their design depending on their field of application.

According to a preferred embodiment of the invention it is provided that the first and/or second electrical connections and/or the light-capturing connections comprise a section tapered in direction away from the luminous bodies. The electrical and light-capturing connections can easily be pierced into the carrier body, especially into and through the electrically conductive layers and the light-guiding layer, by means of these sections which extend to the ends of the connections facing away from the luminous bodies. The connections can be needle-shaped, conical or pyramid-shaped, for example. However, likewise only one or two of the connections may comprise a tapered section at least at the end that is remote from the luminous bodies. For example, the first electrical connection can be placed as a blunt pin or as a flat contact element on the first electrically conductive layer. If at least the light-detecting connection and the second electrical connection are pierced into the carrier body, in the case of low mechanical loads on the device, additional fastening means for the luminous bodies on the carrier body can be dispensed with. In some cases, however, it may be expedient to fix the luminous bodies to the carrier body additionally by means of an adhesive connection.

For a cost-effective production of the device for image representation in numerous fields of application, it is favourable if the luminous bodies are light emitting diodes (LEDs), preferably RGB LEDs driveable for emitting different light colours or electrically deformable materials, in particular piezoelectric crystals. While LEDs are inexpensive active illuminants which jointly allow the display of moving or static, single-colour or multi-colour images, such images can also be generated with the electrically deformable materials such as piezoelectric crystals, by their deformation and a resulting different light reflection. Special effects of the image representation can be achieved if the electrically deformable materials themselves are irradiated with selected light patterns. Of course, an array of LEDs and electrically deformable materials on the same carrier body is also conceivable.

If the carrier body is flexible, the device for image representation can be attached fitting to uneven, especially curved surfaces. For example, the carrier body can be attached to uneven advertising surfaces, such as columns, over its surface, preferably over its entire surface, in order to use the device as a billboard or a curved display. In addition, a flexible carrier body can be stored in a space-saving manner, for example rolled-up manner, or be used as a roll-up image area like a type of a roller blind with fixed or variable image content and serving as a visual protection. It can also be used as an illumination surface mounted on uneven surfaces. The maximum achievable magnitude of bending or the smallest possible radius of bend depends, among other things, on the materials used and the thickness and specific structure of the device. For example, the radius of bend can be at least 20 cm, with a thickness of the carrier body of at least 3 mm. The first and second electrically conductive layers as well as the light-guiding layer are made of a flexible or pliable material. It is also possible that the first and second electrical connections and the light-capturing connections are made of a flexible or pliable material so as to avoid counteracting any process of bending the carrier body as far as possible. The thickness of the carrier body is conveniently very much smaller than its length and width dimensions, so that the carrier body can be designed as a film.

If the first electrically conductive layer is connected to a top layer at least partially embedding the luminous bodies, the device can be effectively protected against damaging mechanical or environmental influences. In addition, the luminous bodies can be fixed in their position on the carrier body, if they are at least partially embedded in the top layer. However, in order to avoid any damage to the luminous bodies as far as possible, it is advisable to completely embed them in the top layer and to manufacture the top layer from an essentially scratch-resistant and/or pressure-resistant, translucent plastic material. A device protected in such a way can also be used in a humid environment or as a floor element. Conveniently, the top layer is also elastic so as not to interfere with bending the device.

In order to mount the device on electrically conductive or current-carrying surfaces and to be able to touch the device safely even during operation, it is advantageous that the second electrically conductive layer is connected to an electrically insulating layer on the side facing away from the luminous bodies. The electrically insulating layer is preferably made of a thin, flexible plastic material.

For quickly attaching the device to a receiving surface, without having to provide separate fastening means, it is favourable if the carrier body comprises fastening means, in particular a self-adhesive layer on the side facing away from the luminous bodies. To be able to reuse the device intact after its disassembly, the fastening means are preferably designed for a releasable attachment of the device. For example, screws, hooks, eyelets, tapes, loops, Velcro fasteners or double-sided adhesive tapes can be used as fastening means.

For reliably feeding any information contained in the light signals into the light conductive layer, it is favourable if the light-guiding layer is connected to a light-feeding device for feeding light signals.

To ensure a reliable signal transmission to the drive units with inexpensive components, it is preferred that the light-feeding device for feeding light signals, the light-guiding layer for light transmission and the drive units for light reception are each designed to work in the infrared range. In this way, interference of the signal transmission due to ambient light in the visible wavelength range can be prevented. In addition, in this frequency range, light can be transmitted in the light-guiding layer at very low attenuation losses. The drive units, if necessary the light-capturing connections, comprise components that detect infrared radiation.

In accordance with a preferred embodiment, it may be provided that the light-feeding device is a part of the light-guiding layer, the part extending beyond the first and/or second electrically conductive layer or a plug connected to the light-guiding layer or a light source connected to the light-guiding layer. A part of the light-guiding layer extending essentially beyond the edge of the carrier body or a plug arranged on the light-guiding layer form a simple connection option, for example a plug or clamp connection, comprising a light-guiding connecting cable. In contrast, a light source arranged on the light-guiding layer can be driven directly via electrical connection cables with electrical signals, without any prior conversion to light signals. The light source is designed in particular for an efficient and low-loss feeding of the light signals generated in this way into the light-guiding layer. For example, the light source can be embedded at least partially in the light-guiding layer, with the electrical connections of the light source protruding from the light-guiding layer.

It is particularly favourable if the light-feeding device is connected to a control device which comprises a memory for addresses and control information for the individually driveable luminous bodies, the control device being designed to feed control signals containing the addresses and the control information into the light-feeding device. The control device thus contains the information required for the individual control of the luminous bodies or the drive units and makes this information available to the light-feeding device via a data circuit. The control drive can thus be positioned at a location remote from the carrier body. Electrically conducting cables may be provided for a wired connection of the control device to the carrier body or the light-feeding device, for example via the Internet, in which case the light-feeding device takes care of converting electrical signals into optical signals, or the connection is established via light-guiding cables, in particular optical fibre cables, if the control device provides the optical signals to be fed into the light-guiding layer. The connection between the control device and the light-feeding device can also be effected wirelessly via a predefined radio standard. In this case, the control device comprises a radio module for transmitting, if necessary also for receiving radio signals, and the light-feeding device comprises a radio module interacting with it for receiving, if necessary also for transmitting radio signals. The memory of the control device contains the addresses of the luminous bodies to be driven and the control information for the luminous bodies selected with the addresses. The control information can include a power-on command, a power-off command and instructions on the luminous colour and/or the brightness to be set for the respective luminous body. In order to create a defined pattern with the luminous bodies, the control device also comprises sequence information in the memory, which determines the time sequence for the individual address and control information to be fed into the light-feeding device. As soon as a drive unit recognizes its own address, said drive unit controls the associated luminous body in accordance with the control information linked to said address. The control device expediently also comprises a processing unit, for example a microprocessor, and input means in order to be able to enter or store the address information, the control information and the sequence information in the control device.

Advantageously, the addresses and/or the control information in the light-guiding layer are formed by light signals in different frequency ranges or by a digital bit sequence. Thus, transmission of the address and control information takes place either analogously, in that each address corresponds to a narrow frequency band and each drive unit has a frequency filter for the frequency band corresponding to its own address, or the transmission takes place digitally, according to a predefined transmission protocol. Preferably, the control information for one or more luminous bodies follows the associated address information, even before the address information will be transmitted for one or more other luminous bodies. However, a combination of analogous and digital transmissions is also conceivable, for example by transmitting only the addresses in the form of light signals in different frequency bands and only the control information in the form of a digital bit sequence.

In order to define the addresses of the luminous bodies, it is useful if each drive unit comprises a predefined address for the luminous body connected thereto or is designed to independently define an address of the luminous body connected thereto. In order to establish a clear connection between the address and the position of the luminous bodies, the drive units can be pre-programmed with a defined, unique address and arranged on the carrier body at positions known to the control device. Alternatively, the drive units may be designed identical, without any individual pre-programming, and may independently define the addresses of the luminous bodies in the state mounted on the carrier body.

The address can be ascertained or determined independently by feeding two reference light signals attenuated along the light-guiding layer from different positions into the light-guiding layer and measuring their position-dependent luminous intensity by the drive units. For this purpose, it is expedient that the light-guiding layer is designed as a light-attenuating layer, a second light-feeding device arranged at an angle, preferably arranged at a right angle to the light-feeding device is connected to the light-guiding layer and the control device, and each drive unit is adapted to measure the attenuated luminous intensity of reference light signals of defined intensities supplied by the control device and the two light-feeding devices, which measured luminous intensities represent the addresses.

The drive units designed to independently define an address are expediently designed to transmit the defined addresses to the control device by means of light signals fed into the light-guiding layer, and the control device is designed to receive the light signals. For this purpose, the drive units comprise transmitting means for the light signals and the control device comprises receiving means for these light signals. In this way, the addresses defined by the drive units are communicated to the control device. To avoid collisions of the light signals representing the addresses as far as possible, they can be sent either in random order or at a time depending on the specified address. The control device is favourably designed to estimate the positions of the luminous bodies on the carrier body assigned to the received addresses in accordance with the address values, since decreasing address values are due to an increasing distance from the light-feeding devices.

However, the control device may also be designed to independently determine the addresses of the luminous bodies defined by the drive units in that the control device comprises values of the reference luminous intensities fed into the light-guiding layer by the light-feeding devices, at least one value of the attenuation of the light-guiding layer and information on the distribution of the luminous bodies on the support body. Thus, the control device can at least approximately calculate the values of the luminous intensities measured by the drive units. For this purpose, it is favourable if the light-guiding layer comprises a defined, preferably equal attenuation in all directions along its entire extension.

Therefore, the device for image representation can be adapted so as to be mechanically resilient, weather-resistant, designable in terms of size and shape, flexible and thin, for example in the form of a film, and easy to mount, for the representation of moving or still, single-colour or multi-colour image contents. In particular, the device can be used as a display, billboard, for the illumination of rooms or as a design element.

BRIEF DESCRIPTION OF THE FIGURES

The invention will be further explained below by using preferred, non-restrictive embodiments with reference to the drawing, in which.

DETAILED DESCRIPTION OF FIGURES

Figure 1:
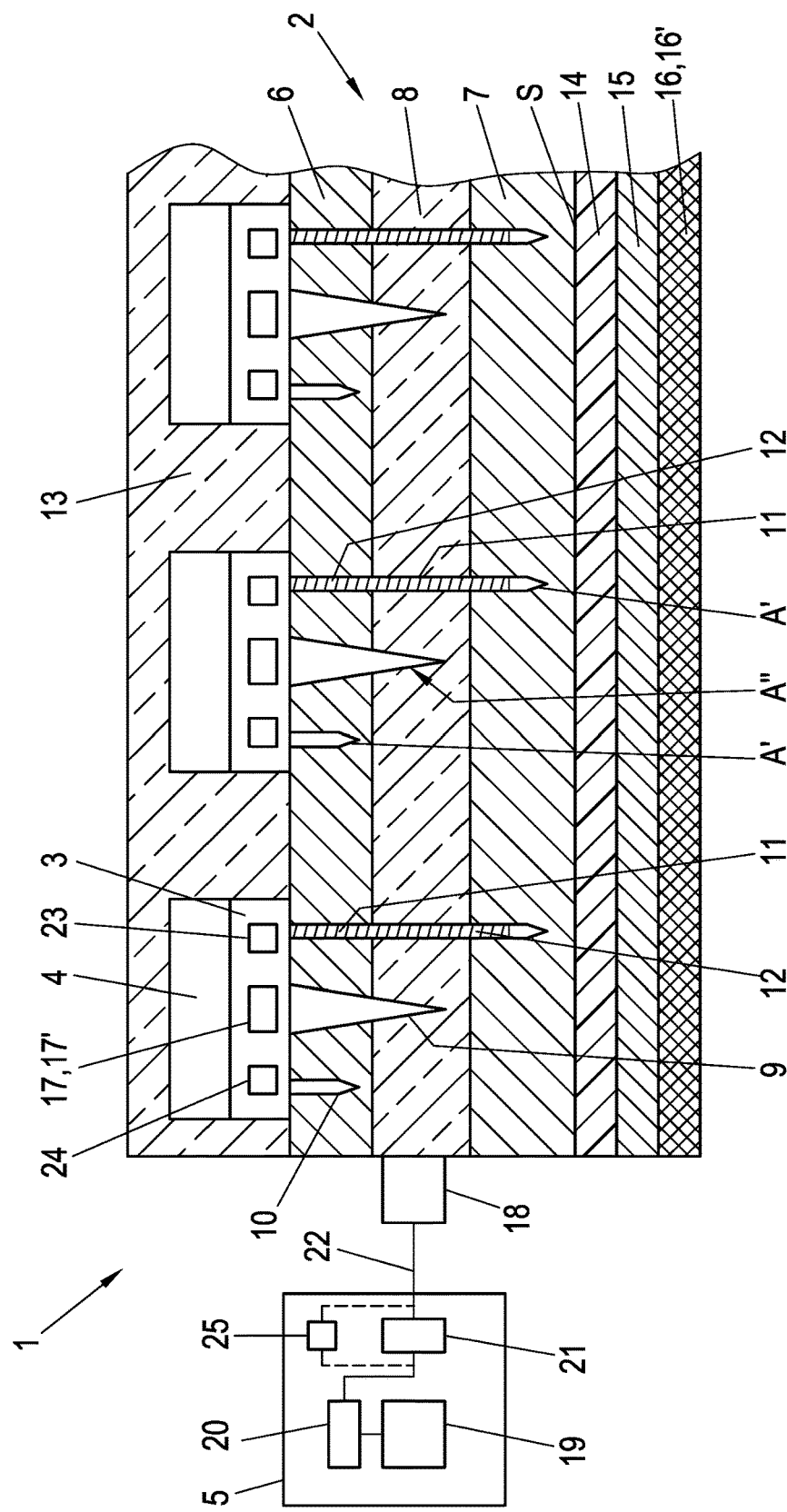
FIG. 1 is a schematic sectional view of an embodiment of a carrier body together with a control device.

FIG. 1 shows a device 1 for image representation comprising a carrier body 2, on which are arranged individually driveable luminous bodies 4 connected respectively to a drive unit 3, and comprising a control device 5. The carrier body 2 comprises a first electrically conductive layer 6 facing the luminous bodies 4, a second electrically conductive layer 7 facing away from the luminous bodies 4, and an electrically insulating light-guiding layer 8 disposed between the first and second electrically conductive layers 6, 7 for conducting light signals. For detecting (capturing) the light signals, according to which the luminous bodies 4 are electrically driven by the drive units 3, the drive units 3 are connected to the light-guiding layer 8 via light-capturing (light-detecting) connections 9. In addition, first electrical connections 10 are provided for connecting the drive units 3 to the first electrically conductive layer 6 and second electrical connections 11 are provided for connecting the drive units 3 to the second electrically conductive layer 7, to supply the drive units 3 and the luminous bodies 4 with power. To facilitate the process of piercing them into the carrier body 2, the first electrical connection 10, the second electrical connection 11 and the light-capturing connection 9 comprise a section A', A" tapered in the direction away from the luminous bodies 4, the electrical connections 10, 11 being needle-shaped with a section A' and the light-capturing connections 9 being conical with a section A". Of course, any other shape of the connections 9, 10, 11 of the drive units 3, which is suitable for piercing, is also conceivable. As can be seen in FIG. 1, the second electrical connection 11, in the state mounted on the carrier body 2, comprises an insulation layer 14 extending at least along the thickness of the first electrically conductive layer 6, to avoid an electrical short circuit of the two electrically conductive layers 6, 7. The light-capturing connection 9 preferably extends as deep as possible into the light-guiding layer 8, to be able to reliably detect (capture) the light signals. Although the first electrical connection 10 is shown in a manner pierced in the first electrically conductive layer 6, it could also be designed as a contact surface resting on the layer 6. In contrast to the embodiment shown in FIG. 1, the electrical connections 10, 11 and the light-capturing connection 9 can also be fixedly provided in the carrier body 2 and extend at least up to the top side of the first electrically conductive layer 6 in order to place the drive units 3 thereon. In this way, the two electrically conductive layers 6, 7 and the light-guiding layer 8 can be designed particularly thin, since no piercing process into the carrier body 2 is required.

The luminous bodies 4, preferably LEDs or piezoelectric crystals are shown with a rectangular cross-section in FIG. 1, but can also be shaped differently, for example in a semi-spherical manner. To protect the luminous bodies 4 from environmental influences or damage, the luminous bodies 4 in the embodiment of FIG. 1 are completely embedded in a translucent top layer 13, which is arranged on the first electrically conductive layer 6. In addition, the carrier body 2 comprises an electrically insulating layer 14 on the side S of the second electrically conductive layer 7, the side S facing away from the luminous bodies 4. To impart additional mechanical stability to the carrier body 2, a support layer 15 can optionally be arranged on the electrically insulating layer 14. A self-adhesive layer 16' arranged on the electrically insulating layer 14 or, as shown in FIG. 1, on the support layer 15, or any other fastening means 16 facilitates the fastening of the support layer 15 on a suitable ground surface. The layers of carrier body 2, i.e. the first electrically conductive layer 6, the second electrically conductive layer 7, the light-guiding layer 8 and, possibly, the top layer 13, the electrically insulating layer 14, the support layer 15 and the self-adhesive layer 16' are preferably flexible in order to be able to fix, in particular adhere the carrier body 2 as completely as possible on uneven surfaces. In addition, the layers of carrier body 2 should also be as thin as possible, for example in the form of a film, and the user of the device should be able to sever them with conventional tools, such as scissors or knives, to change the shape of carrier body 2 as needed. The area of the carrier body 2 may range from a few cm2 to several m2, for example between 5 cm2 and 10 m2, preferably between 100 cm2 and 2 m2 when used as a display. The total thickness of the carrier body 2, including the top layer 13, the electrically insulating layer 14, the support layer 15 and the self-adhesive layer 16' is expediently in the range of a few millimeters and preferably amounts to between 3 mm and 10 mm. The carrier body 2 can be protected against damage even better if the light-guiding layer 8 comprises a self-regenerating plastic.

For capturing the light signals in the light-guiding layer 8, the drive unit 3 comprises a receiver 17 for light signals, preferably for infrared signals. In the embodiment of FIG. 1, the receiver 17 is arranged in a portion outside the light-capturing connection 9 of the drive unit 3, wherein the light-capturing connection 9 is designed to forward the light signals to the receiver 17. The drive unit 3 converts the received light signals into electrical signals, with which the light output of the luminous bodies 4 is controlled.

Figure 2:
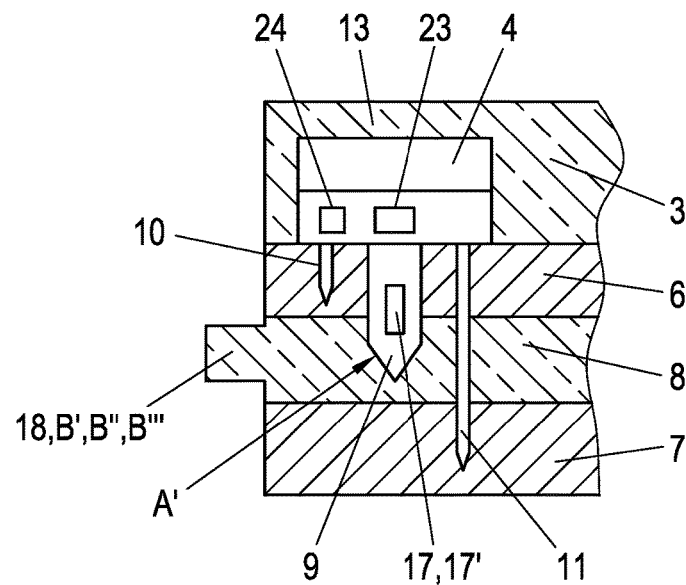
FIG. 2 shows a part of a carrier body according to another embodiment.

In order to be able to feed light signals into the light-guiding layer 8, the light-guiding layer 8 is connected to a light feed device 18. As can be seen from FIG. 2, the light-feeding device 18 can be a part B' of the light-guiding layer 8, the part B' extending beyond the first and/or second electrically conductive layer 6, 7 or a plug B" connected to the light-guiding layer 8 or a light source B'" connected to the light-guiding layer 8. FIG. 2 also shows a needle-shaped, light-capturing connection 9 with a tapered section A', designed differently to the illustration in FIG. 1. In addition, the light-capturing connection 9 also comprises the receiver 17 for light signals.

As can also be seen in FIG. 1, the light-feeding device 18 is connected to the control device 5 which comprises a memory 19 for addresses and control information for the individually driveable luminous bodies 4. In addition, the control device comprises a processing unit 20, in particular a microprocessor, for providing the control signals containing the addresses and the control information and a unit 21 for generating the electrical or optical control signals to be fed into the light-feeding device 18. The control unit 5, in particular the unit 21 is connected to the light-feeding device 18 via a cable 22 or via a radio module not shown.

Figure 3:
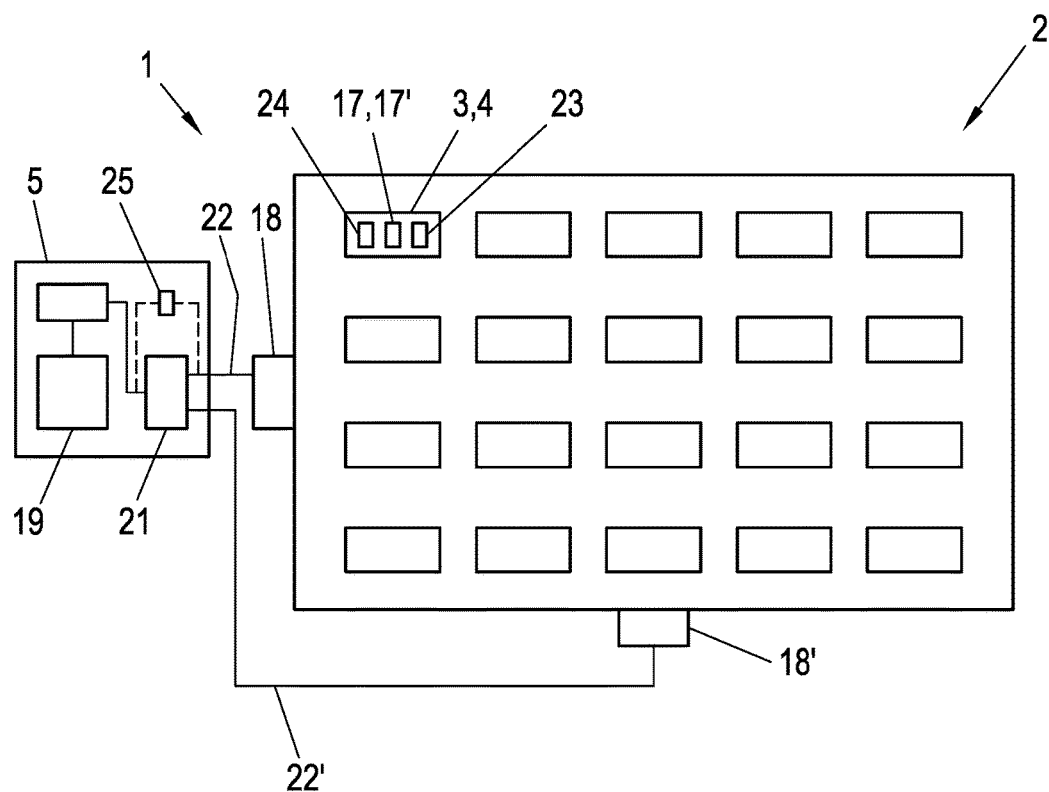
FIG. 3 is a schematic top view of the device according to invention.

FIG. 3 shows a top view of a rectangular carrier body 2 connected to the control device 5 and comprising luminous bodies 4 arranged in the form of a matrix. In case the drive units 3 are not pre-programmed with defined addresses, the drive units 3 can be designed for an independent determination of their addresses. For this purpose, the control device 5 is connected via a cable 22' to a second light-feeding device 18', wherein the light-feeding devices 18, 18' are preferably arranged on different side surfaces of the support body 2 which preferably enclose a substantially right angle. To determine the addresses, the drive units 3 measure the location-dependent intensities of reference light signals which are fed into the light-guiding layer 8 by the light-feeding devices 18, 18' with a defined intensity. For this purpose, the drive units 3 comprise a measuring device 23. In this case, the light-guiding layer 8 is designed to attenuate light. The pre-programmed or the independently defined addresses of the luminous bodies 4 are stored in a memory 24 of the drive units 3. In order to transmit the independently determined addresses with light signals to the control device 5, the drive units 3 comprise transmitting devices 17' for the light signals and the control device 5 comprises a receiving device 25 (cf. FIG. 1) for these light signals.

The invention claimed is:

1. A device for image representation, comprising a carrier body on which are arranged individually driveable luminous bodies connected respectively to a drive unit, wherein the carrier body comprises a first electrically conductive layer facing the luminous bodies, a second electrically conductive layer facing away from the luminous bodies and a light-guiding layer arranged between the first and the second electrically conductive layer configured to guide light signals, wherein the drive units are connected to the light-guiding layer via light-capturing connections, wherein first electrical connections connecting the drive units to the first electrically conductive layer and second electrical connections connecting the drive units to the second electrically conductive layer are provided, wherein the drive units drive the luminous bodies depending on light signals fed into the light-guiding layer.

2. The device according to claim 1, wherein the first and/or second electrical connections and/or the light-capturing connections comprise a section tapering in the direction away from the luminous bodies.

3. The device according to claim 1, wherein the luminous bodies are light-emitting diodes (LEDs), preferably RGB LEDs configured to emit different light colours or the luminous bodies are electrically deformable materials.

4. The device according to claim 1, wherein the carrier body is flexible.

5. The device according to claim 1, wherein the first electrically conductive layer is connected to a top layer at least partially embedding the luminous bodies.

6. The device according to claim 1, wherein the second electrically conductive layer is connected to an electrically insulating layer on the side facing away from the luminous bodies.

7. The device according to claim 1, wherein the carrier body comprises a fastening means, on the side facing away from the luminous bodies.

8. The device according to claim 1, wherein the light-guiding layer is connected to a light-feeding device configured to feed light signals.

9. The device according to claim 8, wherein the light-feeding device, the light-guiding layer and the drive units are each configured to work in the infrared range.

10. The device according to claim 8, wherein the light-feeding device is a part of the light-guiding layer and extends beyond the first and/or second electrically conductive layer or a plug connected to the light-guiding layer or a light source connected to the light-guiding layer.

11. The device according to claim 10, wherein the light-feeding device is connected to a control device which comprises a memory for addresses and control information for the individually driveable luminous bodies, the control device feeding control signals containing the addresses and the control information into the light-feeding device.

12. The device according to claim 11, wherein the addresses and/or the control information in the light-guiding layer are formed by light signals in different frequency ranges or by a digital bit sequence.

* * * * *